(12) United States Patent
Camacho et al.

(10) Patent No.: US 8,692,377 B2
(45) Date of Patent: Apr. 8, 2014

(54) INTEGRATED CIRCUIT PACKAGING SYSTEM WITH PLATED LEADS AND METHOD OF MANUFACTURE THEREOF

(75) Inventors: Zigmund Ramirez Camacho, Singapore (SG); Henry Descalzo Bathan, Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 277 days.

(21) Appl. No.: 13/069,744

(22) Filed: Mar. 23, 2011

(65) Prior Publication Data

US 2012/0241966 A1   Sep. 27, 2012

(51) Int. Cl.
*H01L 23/498* (2006.01)

(52) U.S. Cl.
USPC ............. 257/773; 257/E21.506; 257/E23.06

(58) Field of Classification Search
USPC .................. 257/773, E21.506, E23.06
See application file for complete search history.

(56) References Cited

U.S. PATENT DOCUMENTS

| | | | |
|---|---|---|---|
| 5,835,988 A * | 11/1998 | Ishii | 257/684 |
| 6,313,520 B1 | 11/2001 | Yoshida et al. | |
| 6,329,711 B1 | 12/2001 | Kawahara et al. | |
| 6,433,418 B1 * | 8/2002 | Fujisawa et al. | 257/696 |
| 6,476,474 B1 | 11/2002 | Hung | |
| 6,518,655 B2 | 2/2003 | Morinaga et al. | |
| 6,605,866 B1 | 8/2003 | Crowley et al. | |
| 6,630,729 B2 | 10/2003 | Huang | |
| 6,730,544 B1 | 5/2004 | Yang | |
| 6,843,421 B2 | 1/2005 | Chhor et al. | |
| 7,156,633 B2 | 1/2007 | Bolken et al. | |
| 7,235,870 B2 | 6/2007 | Punzalan, Jr. et al. | |
| 7,279,784 B2 * | 10/2007 | Liu | 257/686 |
| 7,550,834 B2 | 6/2009 | Yu et al. | |
| 7,808,093 B2 | 10/2010 | Kagaya et al. | |
| 7,997,782 B2 | 8/2011 | Cornelissen et al. | |
| 8,053,276 B2 | 11/2011 | Yu et al. | |
| 8,053,880 B2 | 11/2011 | Yu et al. | |
| 8,067,821 B1 | 11/2011 | Choi et al. | |
| 2002/0158316 A1 | 10/2002 | Lee et al. | |
| 2003/0189256 A1 | 10/2003 | Corisis et al. | |
| 2007/0158799 A1 | 7/2007 | Chiu et al. | |

FOREIGN PATENT DOCUMENTS

| | | | |
|---|---|---|---|
| JP | 2001177005 A | 6/2001 | |
| KR | 1020010064913 A | 7/2001 | |
| KR | 1020010064914 A | 7/2001 | |

* cited by examiner

*Primary Examiner* — Long Pham
(74) *Attorney, Agent, or Firm* — Ishimaru & Associates LLP

(57) ABSTRACT

An integrated circuit packaging system and method of manufacture thereof includes: an L-plated lead; a die conductively connected to the L-plated lead; and an encapsulant encapsulating the L-plated lead and the die.

10 Claims, 3 Drawing Sheets

INTEGRATED CIRCUIT PACKAGING SYSTEM WITH PLATED LEADS AND METHOD OF MANUFACTURE THEREOF

TECHNICAL FIELD

The present invention relates generally to an integrated circuit packaging system, and more particularly to a system with plated leads.

BACKGROUND ART

Electrical products must compete in world markets and attract many consumers or buyers to be successful. As a result, it is very important for products to continue to improve in features, performance, and reliability while reducing product costs, product size, and equally important to be available quickly for purchase by the consumers or buyers.

The demand for high density and high output/input integrated circuit packages dramatically increased with the trend of electronic products toward lightweight, small size, multi-function, and high speed products. Therefore, components in the package are becoming thinner and thinner to reduce the size of the whole package effectively and the capability of stacking more packages on top of each other. Electronic products such as cell phone base products, global positioning systems (GPS), satellites, communication equipment, consumer products, and a vast line of other similar products are in ever increasing global demand.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages and electrical parts using electrical connections on circuit boards.

Time to market, reliability, the number of integrated circuit packages, and the number of electrical parts on the circuit boards inside a product are important to improving the features, performance, and reliability of any product. Furthermore, the ways the circuitry and electrical connections are implemented have a direct impact on the availability, reliability, and costs of products.

Attempts have failed to provide a complete solution addressing simplified manufacturing processing, ease of stacking, time to market, improved reliability, reduced electrical parts on the circuit boards, and size reductions of the circuit boards with increased functionality, leveragability, and increased product features to the consumer.

In view of the problems and process requirements, it is increasingly critical that answers be found. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a sacrificial support having a cavity provided therein; plating an L-plated lead in the cavity; bonding a die in the cavity conductively connected to the L-plated lead; encapsulating the L-plated lead and the die; attaching a carrier support to the sacrificial support; removing the sacrificial support; and singulating the carrier support into an individual integrated circuit packaging system.

The present invention provides an integrated circuit packaging system, including: an L-plated lead; a die conductively connected to the L-plated lead; and an encapsulant encapsulating the L-plated lead and the die.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
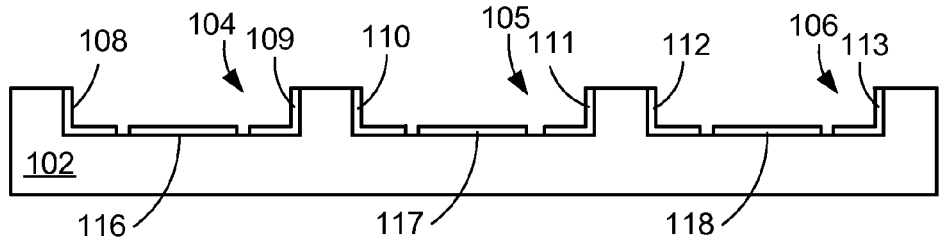
FIG. 1 is a cross-sectional view of a rectangular sacrificial support after a plating step in the manufacture of an integrated circuit packaging system in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

Referring now to FIG. 1, therein is shown a cross-sectional view of a rectangular sacrificial support after a plating step in the manufacture of an integrated circuit packaging system in accordance with an embodiment of the present invention.

A rectangular sacrificial support 102 is provided with generally rectangular cavities 104-106. The sacrificial support 102 is made of an easily removable material, such as copper, which can be easily etched away. The top surfaces of the sacrificial support 102 and the insides of the cavities 104-106 are patterned with a resist to allow plating on the bottom and side walls of the cavities 104-106. An electro- or electroless-plating process is used to form individual L-plated leads 108-113.

In another embodiment, the cavities 104-106 are also patterned for the deposition of plated die attach paddles 116-118 co-planar with horizontal surfaces on the L-plated leads 108-113.

The L-plated leads 108-113 and the plated die attach paddles 116-118 may be a single layer, such as nickel, or multiple layer plating, such as nickel palladium.

Figure 2:
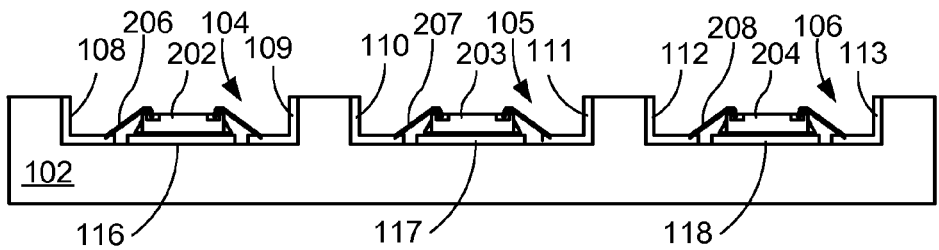
FIG. 2 is the cross-sectional view of FIG. 1 in a die attach step of manufacture of the integrated circuit packaging system.

Referring now to FIG. 2, therein is shown the cross-sectional view of FIG. 1 in a die attach step of manufacture of the integrated circuit packaging system.

Integrated circuit dies 202-204 may be die attached directly to the sacrificial support 102 or to the plated die attach paddles 116-118.

After die attach, the dies 202-204 are wire bonded by wires 206-208 to the L-plated leads 108-113. It will be understood that the conductive connection from the dies 202-204 to the L-plated leads 108-113 could also be through other conductive connections, such as solder balls.

Figure 3:
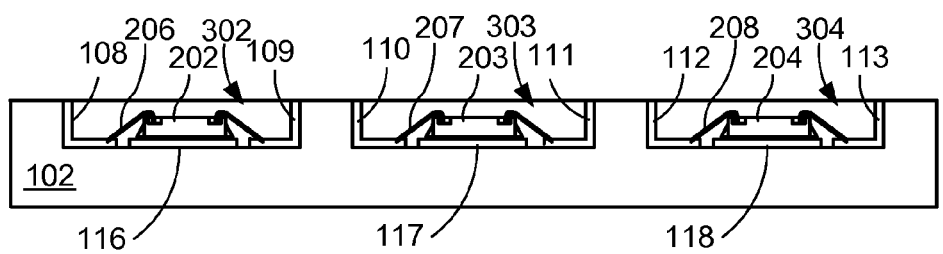
FIG. 3 is the cross-sectional view of FIG. 2 in an encapsulation step of manufacture of the integrated circuit packaging system.

Referring now to FIG. 3, therein is shown the cross-sectional view of FIG. 2 in an encapsulation step of manufacture of the integrated circuit packaging system.

The dies 202-204 and the L-plated leads 108-113 are embedded in encapsulants 302-304. The encapsulants 302-304 can be underfill material or epoxy molding compound which may be either liquid poured or injection molded.

Figure 4:
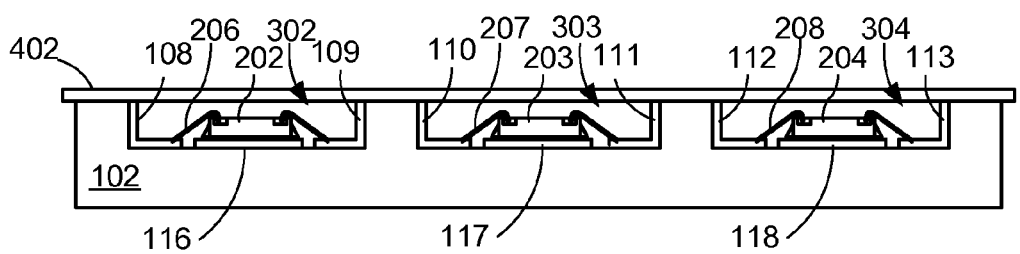
FIG. 4 is the cross-sectional view of FIG. 3 in a support attach step of manufacture of the integrated circuit packaging system.

Referring now to FIG. 4, therein is shown the cross-sectional view of FIG. 3 in a support attach step of manufacture of the integrated circuit packaging system.

A carrier support 402, such as an adhesive carrier tape is placed on the sacrificial support 102, the L-plated leads 108-113 and the encapsulants 302-304 in preparation of the singulation process.

Figure 5:
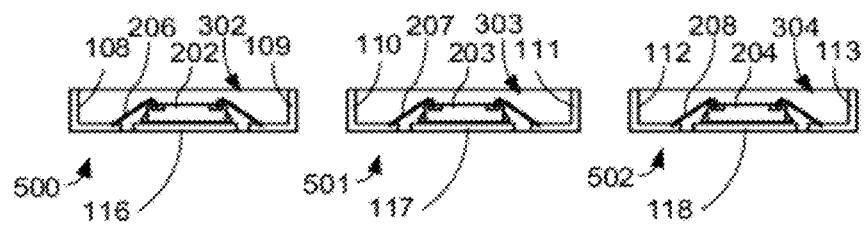
FIG. 5 is the cross-sectional view of FIG. 4 in a singulation step of manufacture of the integrated circuit packaging system.

Referring now to FIG. 5, therein is shown the cross-sectional view of FIG. 4 in a singulation step of manufacture of the integrated circuit packaging system.

The sacrificial support 102 is removed to singulate the integrated circuit packaging systems 500-502. For example for copper, a copper strip etch is used for the removal process.

The individual integrated circuit packaging systems 500-502 are then removed from the carrier support 402.

Figure 6:
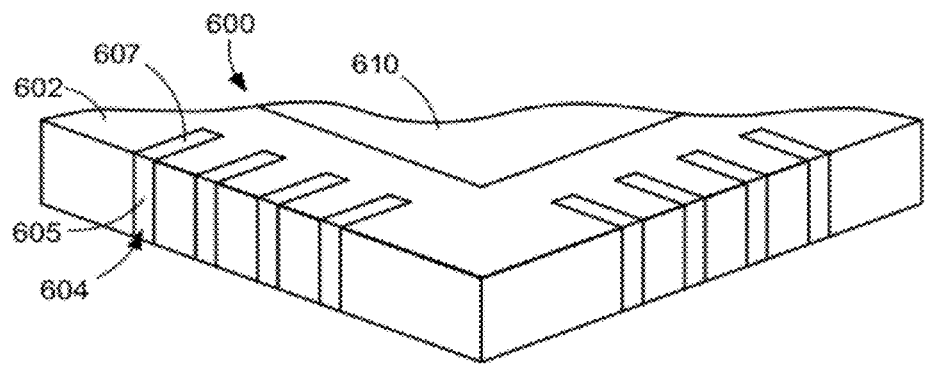
FIG. 6 is a partial isometric view of a bottom portion of an integrated circuit packaging system in accordance with an embodiment of the present invention.

Referring now to FIG. 6, therein is shown a partial isometric view of a bottom portion of an integrated circuit packaging system in accordance with an embodiment of the present invention.

An integrated circuit packaging system 600 has an encapsulant 602 in which L-plated leads 604 are embedded with only vertical surfaces 605 on each of the L-plated leads 604 being exposed from the encapsulant 602. Also exposed by the encapsulant 602 are horizontal surfaces 607 on each of the L-plated leads 604. A small horizontal surface of the L-plated lead is also exposed by the encapsulant 602 in the hidden surface of the integrated circuit packaging system 600.

In another embodiment of the present invention, a plated die attach paddle 610 is also exposed from the encapsulant 602 of the integrated circuit packaging system 600.

Figure 7:
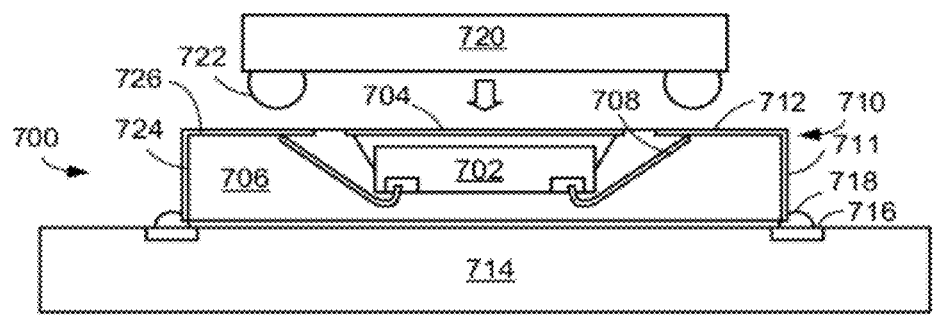
FIG. 7 is a side view of an embodiment of the integrated circuit packaging system of the present invention being stacked.

Referring now to FIG. 7, therein is shown a side view of an embodiment of the integrated circuit packaging system of the present invention being stacked.

A flipped integrated circuit packaging system 700 includes a die 702 attached to a plated die attach paddle 704 and embedded in an encapsulant 706. It will be understood that the die 702 could also be another integrated circuit packaging system. Bond wires 708 conductively connect the die 702 to L-plated leads 710 having vertical surfaces 711 and horizontal surfaces 712. The L-plated leads 710 include a horizontal portion 726 and a vertical portion 724 extending from the horizontal portion 726. The encapsulant 706 is in direct contact with both the horizontal portion 726 and the vertical portion 724. The encapsulant 706 partially encapsulates and partially exposes both the horizontal portion 726 and the vertical portion 724.

A first module 714, having bond pads 716, is conductively connected by conductive bumps 718 to the vertical surfaces 711 and small horizontal surfaces of the L-plated leads 710. The first module 714 can be a printed circuit board, other substrate, die, or another integrated circuit packaging system.

A second module 720, having solder balls 722, is conductively connected by the solder balls to the horizontal surfaces 712 of the L-plated leads 710. The second module 720 can be a printed circuit board, other substrate, die, or another integrated circuit packaging system.

It has been discovered that the conductive connections to the vertical surfaces 711 and horizontal surfaces 712 provide a simple structural connection for stacked systems and substantially improve board level reliability.

Figure 8:
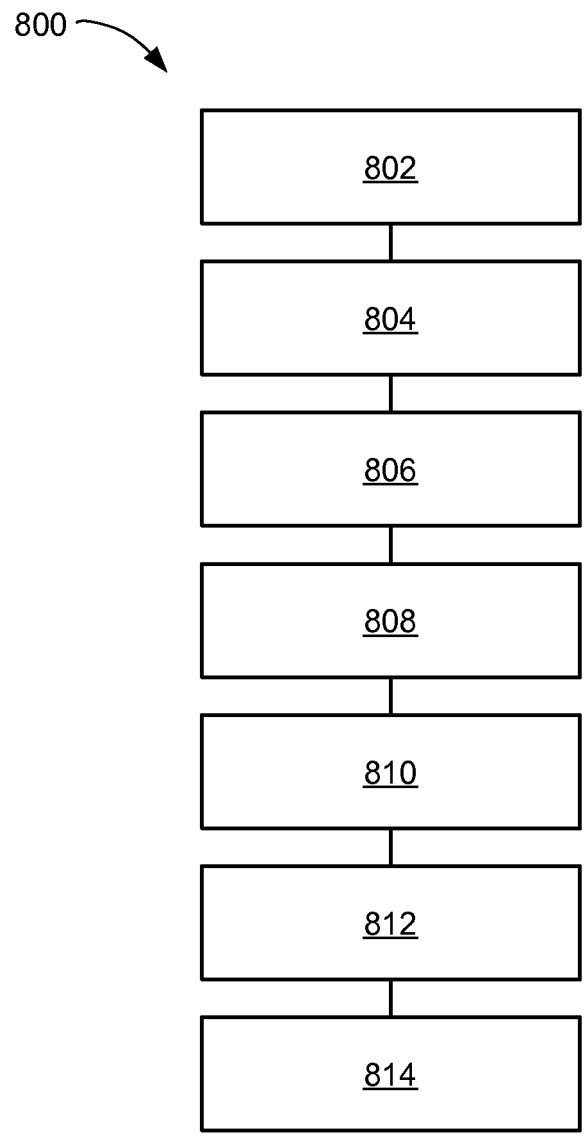
FIG. 8 is a flow chart of a method of manufacture of an integrated circuit packaging system in an embodiment of the present invention.

Referring now to FIG. 8, therein is shown a flow chart of a method of manufacture of an integrated circuit packaging system in an embodiment of the present invention. The manufacturing method 800 includes: providing a sacrificial support having a cavity provided therein in a block 802; plating an L-plated lead in the cavity in a block 804; bonding a die in the cavity conductively connected to the L-plated lead in a block 806; encapsulating the L-plated lead and the die in a block 808; attaching a carrier support to the sacrificial support in a block 810; removing the sacrificial support in a block 812; and singulating the carrier support into an individual integrated circuit packaging system in a block 814.

The resulting method, process, apparatus, device, product, and system are straightforward, cost-effective, uncomplicated, highly versatile and effective, can be surprisingly and unobviously implemented by adapting known technologies, and are thus readily suited for efficiently and economically manufacturing packaging systems and are fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   an L-plated lead having a vertical portion extending from a horizontal portion;
   wherein the vertical portion includes a horizontal surface, an inner surface and an outer surface;
   wherein the horizontal portion includes an inner surface and an outer surface;
   a die conductively connected to the L-plated lead;
   an encapsulant encapsulating and in direct contact with the L-plated lead and the die, the encapsulant encapsulating the inner surface of the horizontal portion and the inner surface of the vertical portion but exposing the horizontal surface of the vertical portion.

2. The system as claimed in claim 1 further comprising a plated die attach paddle co-planar with a portion of the L-plated lead.

3. The system as claimed in claim 1 wherein the encapsulant exposes the outer surface of the vertical portion and the outer surface of the horizontal portion of the L-plated lead.

4. The system as claimed in claim 3 further comprising:
   a first module bonded to the at least one of the horizontal surface and the outer surface of the vertical portion of the L-plated lead.

5. The system as claimed in claim 4 further comprising:
   a second module bonded to the outer surface of the horizontal portion of the L-plated lead.

6. The system as claimed in claim 1 further comprising:
   further L-plated leads, wherein each of the L-plated leads includes a vertical portion extending from a horizontal portion, wherein the vertical portion includes a horizontal surface, an inner surface and an outer surface, wherein the horizontal portion includes an inner surface and an outer surface; and wherein:
   the die is conductively connected by wires to the L-plated leads.

7. The system as claimed in claim 6 further comprising:
   a plated die attach paddle plated co-planar with portions of the L-plated leads; and wherein:
   the die is attached to the plated die attach paddle.

8. The system as claimed in claim 6 wherein the encapsulant exposes the outer surface of the vertical portion and the outer surface of the horizontal portion on each of the L-plated leads.

9. The system as claimed in claim 8 further comprising:
   a first module solder bonded to the at least one of the horizontal surface and the outer surface of the vertical portion on each of the L-plated leads.

10. The system as claimed in claim 9 further comprising:
    a second module ball bonded to the outer surface of the horizontal portion on each of the L-plated leads.

* * * * *